US006816999B2

(12) United States Patent
Lee (10) Patent No.: US 6,816,999 B2
(45) Date of Patent: Nov. 9, 2004

(54) METHOD OF EXTRACTING INTERCONNECTION CAPACITANCE OF SEMICONDUCTOR INTEGRATED CHIP AND RECORDING MEDIUM FOR RECORDING THE SAME

(75) Inventor: Keun-ho Lee, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 218 days.

(21) Appl. No.: 10/266,604

(22) Filed: Oct. 9, 2002

(65) Prior Publication Data

US 2003/0107134 A1 Jun. 12, 2003

(30) Foreign Application Priority Data

Dec. 11, 2001 (KR) ........................................ 2001-78285

(51) Int. Cl.[7] .............................................. G06F 17/50
(52) U.S. Cl. .................................. 716/5; 716/4; 716/6
(58) Field of Search ............................ 716/4–6, 19–21; 257/508; 438/622

(56) References Cited

U.S. PATENT DOCUMENTS

| | | | | |
|---|---|---|---|---|
| 5,790,417 A | * | 8/1998 | Chao et al. .................... | 716/21 |
| 6,028,986 A | * | 2/2000 | Song .............................. | 716/1 |
| 6,192,507 B1 | * | 2/2001 | Ruehli et al. .................. | 716/5 |
| 6,678,879 B1 | * | 1/2004 | Hawse et al. ................. | 716/21 |
| 2002/0157076 A1 | * | 10/2002 | Asakawa ...................... | 716/10 |
| 2003/0051225 A1 | * | 3/2003 | Mori ............................ | 716/19 |

OTHER PUBLICATIONS

Elsherbeni et al. "Coupling between two-conductor multi-layer shielded microstrip transmission line", Proceedings SSST '93, Twenty-Fifth Southeastern Symposium on System Theory, 1993, Mar. 7, 1993, pp. 6–10.*

Kolbehdari et al. "Finite and infinite element analysis of coupled cylindrical microstrip line in a nonhomogeneous dielectric media", Proceedings of IEEE Southeastcon '95, Mar. 26, 1995, pp. 269–273.*

Affane et al. "Quasi static analysis of hybrid and monolithic integrated circuits interconnections", Procedings of 43rd Electronic Components and Technology Conference, Jun. 1, 1993, pp. 1055–1060.*

Takeuchi et al. "A technology for high density mounting utilizing polymeric multilayer substrate", IEEE Proceedings of Electroni Manufacturing Technology Symposium, Japan IEMT Symposium, Sixth IEEE/CHMT Int rnational, Apr. 26, 1989, pp. 136–140.*

Keun–Ho Lee et al., "Analyzing the Effects of Floating Dummy–Fills: From Feature Scale Analysis to Full–Chip RC Extraction", Dec. 2001 Sponsored by Electronic Devices Society of IEEE.

* cited by examiner

*Primary Examiner*—Vuthe Siek
*Assistant Examiner*—Naum Levin
(74) *Attorney, Agent, or Firm*—Harness Dickey (57) ABSTRACT

A method of extracting the interconnection capacitance of a semiconductor integrated circuit is provided. An interconnection structure composed of a plurality of signal lines and dummy conductive patterns disposed between the signal lines is made into data. Data on interconnection structure primitives, which are made by changing portions of the dummy patterns into high-k dielectric materials is generated based on the interconnection structure data. Capacitance of the interconnection structure is then extracted by inputting data on the interconnection structure primitives to an RC extractor and operating the data. According to this method, extracting interconnection capacitance is easily applied to various types of RC extractors. Moreover, the time required to extract the interconnection capacitance is reduced.

18 Claims, 9 Drawing Sheets

METHOD OF EXTRACTING INTERCONNECTION CAPACITANCE OF SEMICONDUCTOR INTEGRATED CHIP AND RECORDING MEDIUM FOR RECORDING THE SAME

CROSS REFERENCE TO RELATED APPLICATIONS

This U.S. nonprovisional patent application claims priority under 35 U.S.C. § 119 to Korean Patent Application No. 2001-78285 filed on Dec. 11, 2001, the contents of which are incorporated by reference.

BACKGROUND OF THE INVENTION

1. Field of the Invention

The present invention relates generally to a design tool of a semiconductor integrated chip. More particularly, the present invention relates to a method of extracting the interconnection capacitance of a semiconductor integrated chip having a multi-layered interconnection and a recording medium for recording the same.

2. Description of the Related Art

Figure 1:
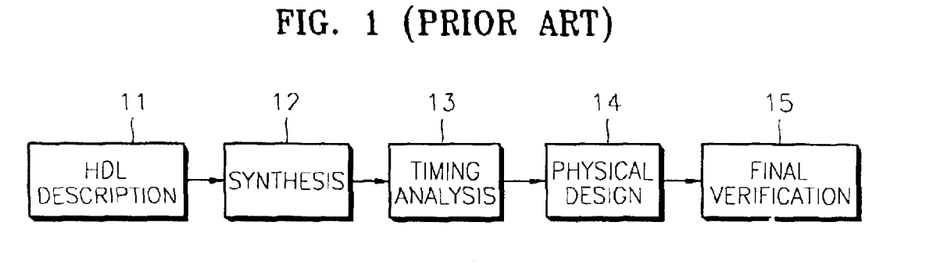
FIG. 1 is a flowchart of a conventional process of designing a general semiconductor integrated circuit.
Figure 2:
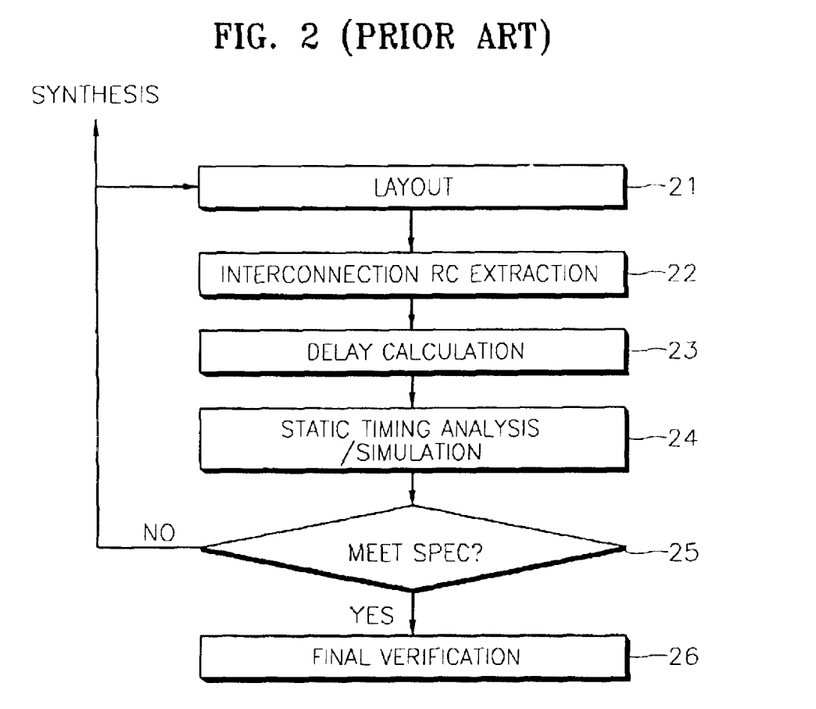
FIG. 2 is a flowchart of the conventional physical design step 14 of FIG. 1.

Referring to FIGS. 1 and 2, a conventional process for forming a semiconductor integrated circuit having predetermined specifications/functions can be seen. First, a high level description language is used to specify the functional and logic designs of the integrated circuit, as is depicted in step 11. Next, as shown in step 12, a synthesis step occurs where the logic circuit is synthesized to a logic gate level circuit using an automatic synthesis tool. A preliminary timing analysis of the logic gate level circuit is performed as shown in step 13. Upon completing various verification steps to ascertain the accuracy of the logic gate level circuit and after satisfying all timing constraints at the gross level, a physical design step is carried out as depicted in step 14.

The physical design step 14 is illustrated in further detail by the flowchart depicted in FIG. 2. As can be seen, the physical design step 14 occurs in several steps. First, the logic gate level circuit described in step 12 of FIG. 1 is laid out in a layout design system (not shown) and unit elements are disposed in an optimum position which is determined in consideration of both the position of the unit elements and the operational relationship between them (step 21). At step 22, an extraction step occurs in which the RC of the interconnection lines for connecting the unit elements is extracted to form an interconnection delay model. However, it should be noted that in a multi-layered interconnection structure with a high density of semiconductor integrated circuits, parasitic capacitance is generated, which has a considerable effect on the operation of semiconductor integrated circuits. As a result, the present parasitic capacitance must be considered in the interconnection RC extraction in step 22.

Next, the interconnection delay model of step 22 is used, as is illustrated in step 23, to calculate signal delay. At step 24, a detailed timing analysis is performed. If the result of the timing analysis/simulation of step 24 verifies that the physical design is within the predetermined spec range, the final verification step for examining the application of the design rule is performed as illustrated in step 26, or alternatively, step 15 of FIG. 1. However, if the result verifies that the physical design is not within the predetermined spec range, the logic circuit must be re-designed (e.g., return to step 12) so that a circuit implementation meeting desired timing requirements can be synthesized. Steps 21 through 24 are then repeated.

Chemical mechanical polishing (CMP) as a planarization technique has been used to obtain multi-layered interconnection structures with high density semiconductor integrated circuits and device patterns. However, the thickness of an insulating layer that has been chemically and mechanically polished is affected by the density of patterns disposed under the insulating layer. In particular, during CMP, an interlevel insulating layer which covers a portion of the semiconductor having a low pattern density is more easily removed than an interlevel insulating layer that covers a portion of the semiconductor having a high pattern density. As a result, dishing occurs, which affects the planarization of the interlevel insulating layers and causes non-uniformity in the electric characteristics of semiconductor devices.

Figure 3:
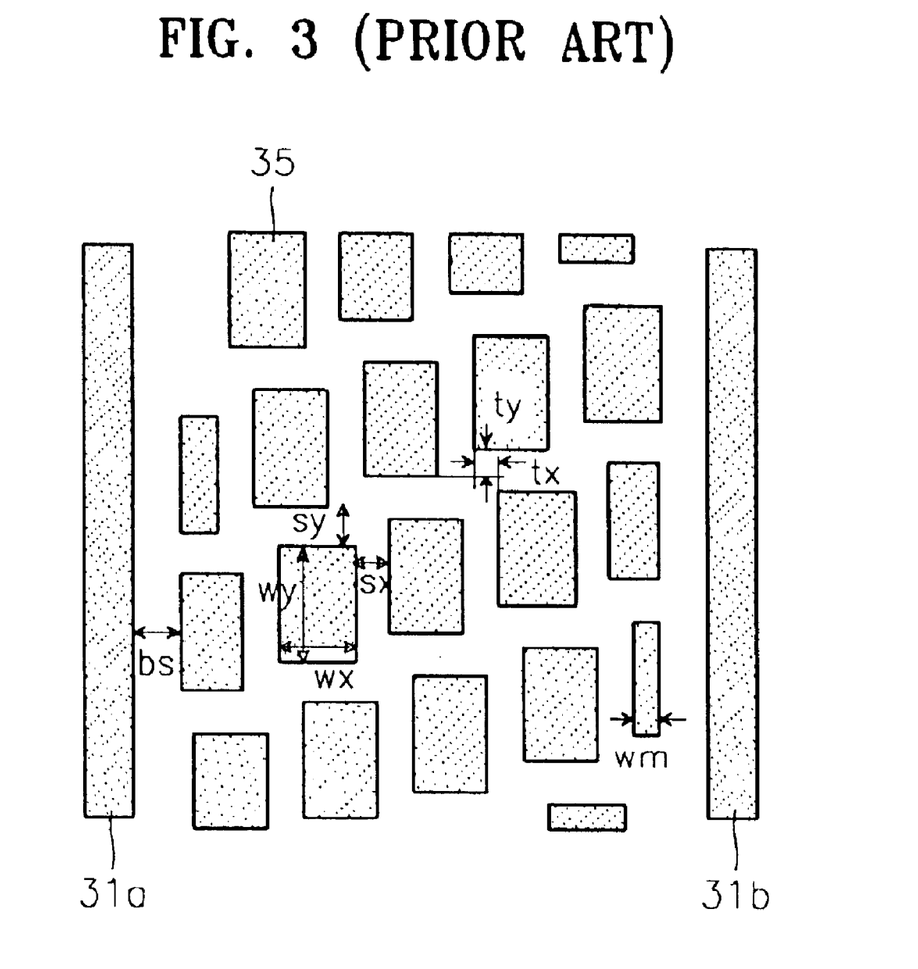
FIG. 3 is a view of general floating dummy patterns filled between signal lines.

To solve the previously-described problems, dummy patterns, which are not included in the design of the semiconductor integrated circuits, are used in the manufacture of semiconductor integrated circuits. These dummy patters are filled into regions of the semiconductor circuit in which patterns are not formed. As illustrated in FIG. 3, a plurality of dummy patterns 35 are obliquely disposed between signal lines 31a and 31b. The dummy patterns 35 and the signal lines 31a and 31b may be placed either in an on-plane mode or in an off-plane mode. In addition, because the dummy patterns 35 are made of a metal, they can be grounded or they can float. Because it is difficult to ground the dummy patterns 35, in most designs of ASIC (Application Specification Integrated Circuit), the dummy patterns 35 remain floating.

As illustrated in FIG. 3, data for specifying the dummy patterns 35 includes widths wx and wy of the dummy patterns 35, distances sx and sy between adjacent dummy patterns 35, shifted distances tx and ty between the dummy patterns 35, a definable minimum distance bs between the dummy patterns 35 and the signal line to buffer the signal line and dummy pattern 35, and a minimum width wm of definable dummy extraction.

If dummy patterns 35 are formed between interconnection lines (i.e., signal lines) in an on-plane mode in a semiconductor integrated circuit having a multi-layered interconnection structure, parasitic capacitance caused by the dummy patterns 35 has to be considered in the interconnection RC extraction step (i.e., step 22 of FIG. 2). Estimation and consideration of the parasitic capacitance due to the dummy patterns 35 must be accurate in order to accurately estimate the whole operation of the semiconductor integrated circuit.

To extract the parasitic capacitance caused by the dummy patterns 35, data on the dummy patterns is processed and input to an RC extractor. Based on the data for specifying the interconnection lines and the processed data for specifying the dummy patterns, the RC extractor outputs the parasitic capacitance with respect to an interconnection structure in which the dummy patterns are combined with the interconnection lines.

However, it is difficult to process data on the dummy patterns and obtain an interconnection structure in which actual dummy patterns are combined with the interconnection lines. In addition, because the dummy patterns are modified into various forms depending on the kinds of RC extractors, it is difficult to directly apply the previously-described parasitic capacitance extraction method to all RC extractors. Furthermore, calculating the parasitic capacitance caused by the dummy patterns results in a considerable increase in the time required for extracting parasitic capacitance of the interconnection structure.

It is therefore desirable to provide a method of extracting the interconnection capacitance of a semiconductor integrated chip having a multi-layered interconnection that can be used regardless of the RC extractor and which overcomes the disadvantages of the known prior art.

SUMMARY OF THE INVENTION

To solve the above-described problems, it is an object of the present invention to provide a method of extracting the interconnection capacitance of a semiconductor integrated circuit that can be used regardless of the type of RC extractor.

It is another object of the present invention to provide a recording medium for recording the method of extracting the interconnection capacitance of a semiconductor integrated circuit.

It is a further object of the present invention to provide a method of extracting the interconnection capacitance in which the time required for extracting the interconnection capacitance is not increased due to the presence of dummy patterns in the semiconductor integrated circuit.

It is yet another object of the present invention to provide a recording medium for the method of extracting the interconnection capacitance when dummy patterns are present.

Accordingly, in at least one exemplary embodiment of the instant invention, there is provided a method of extracting the interconnection capacitance of a semiconductor integrated circuit that can be used regardless of the RC extractor used. In this embodiment, an interconnection structure composed of a plurality of signal lines and dummy conductive patterns disposed between the signal lines is made into data. Interconnection structure primitives are then made by changing portions of the dummy patterns into high-k dielectric materials. Data is generated on these interconnection structure primitives based on the interconnection structure data. Capacitance of the interconnection structure is then extracted by inputting data on the interconnection structure primitives to an RC extractor and operating the data. Thereafter, subsequent design works, e.g., calculating the delay time of the operation of a circuit using the extracted RC, are performed.

In at least one embodiment of the invention, the interconnection structure primitives include buffer dielectric layers which are formed along the signal lines and which have low dielectric constants between the high-k dielectric materials and the signal lines. In addition, the data on the interconnection structure primitives includes dielectric constants, widths of the high-k dielectric layers, widths of the dielectric constants, and widths of the buffer dielectric layers. The dielectric constants of the high-k dielectric layers are determined using the results of a 3-dimensional simulation of an interconnection structure, which is performed in consideration of the dummy patterns. The dielectric constants of the buffer dielectric layers are equal to the dielectric constants of the insulating layers which insulate the signal lines in the interconnection structure.

In another exemplary embodiment of the present invention, there is provided a recording medium for recording a method of extracting the interconnection capacitance of a semiconductor integrated circuit. The recording medium includes a program module for making an interconnection structure into data. Composed of a plurality of signal lines and dummy conductive patterns disposed between the signal lines. The recording medium also includes a program module for generating data on the interconnection structure primitives, which are made by changing portions of the dummy patterns into high-k dielectric materials. Finally, the recording medium includes a program module for extracting the capacitance of the interconnection structure by inputting data on the interconnection structure primitives to an RC extractor and operating the data.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, the present invention will be described in detail with reference to the attached drawings. However, the embodiments of the present invention can be modified into various other forms, and the scope of the present invention must not be interpreted as being restricted to the described embodiments. The embodiments are provided to more completely explain the present invention to those skilled in the art.

In order to describe a method of extracting interconnection capacitance of a semiconductor integrated circuit according to the present invention, the effects of floating dummy patterns on the interconnection capacitance will be described in detail with reference to FIGS. 4A–4C.

Figure 4A:
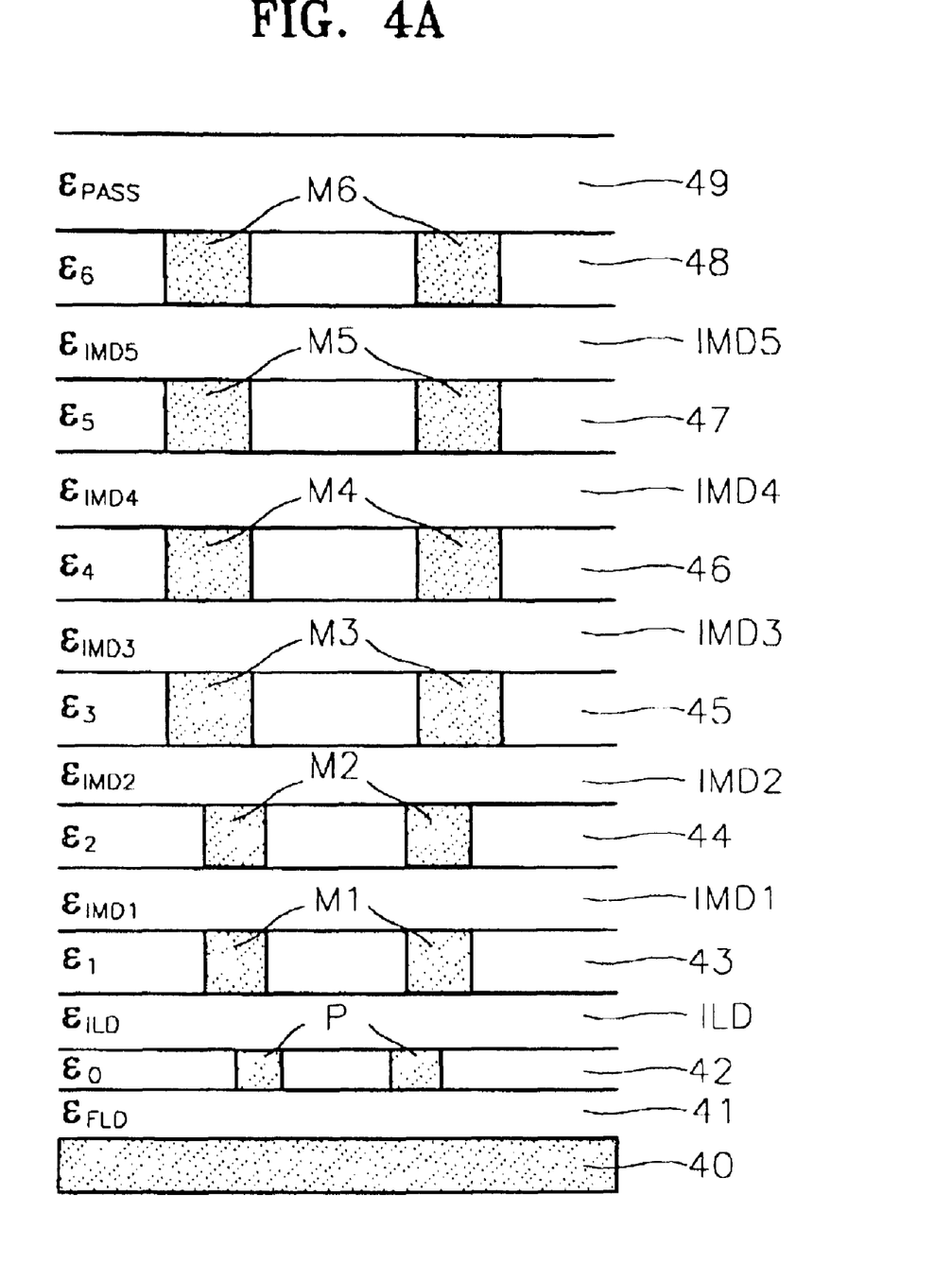
FIG. 4A is a cross-sectional view of interconnection structure primitives for generating data on a multi-layered interconnection structure.

Referring first to FIG. 4A, dummy patterns are obliquely disposed between signal lines M1 through M6. In FIG. 4A, reference numerals 40, 41, and P represent a silicon substrate, a field oxide layer, and a polysilicon layer, respectively. Reference numerals 42, 43, 44, 45, 46, 47, and 48 represent insulating layers for insulating the polysilicon layer or signal lines which are positioned in an on-plane mode. Reference numeral 49 represents a passivation layer, and ILD, IMD1, IMD2, IMD3, IMD4, and IMD 5 are interlevel insulating layers for insulating signal lines which are disposed on and beneath the interlevel insulating layers. The designation "$\epsilon i$", where i is 1, 2, 3, 4, 5, or 6, represents a dielectric constant. A 3-dimensional field solver which is optimized for processing floating dummy patterns is used in the calculation of the capacitance.

In FIG. 4A, the thickness of the field oxide layer 41 is 0.25 μm, the thickness of the insulating layer 42 and the polysilicon layer P is 0.2 μm, the thickness of the insulating layers ILD, IMD1, and IMD2 is 0.5 μm, and the thickness of insulating layers IMD3, IMD4, and IMD5 is 0.7 μm. In addition, the thickness of the signal lines M1 and M2 is 0.4 μm, the thickness of the signal lines M3, M4, and M5 is 0.6 μm, and the thickness of the signal line M6 is 1.2 μm. In the dummy patterns, bs is 0.8 μm, wx is 1.5 μm, wy is (4wx/3), sx and sy are 0.5 mm, and wm is wx/13.

Figure 4B:
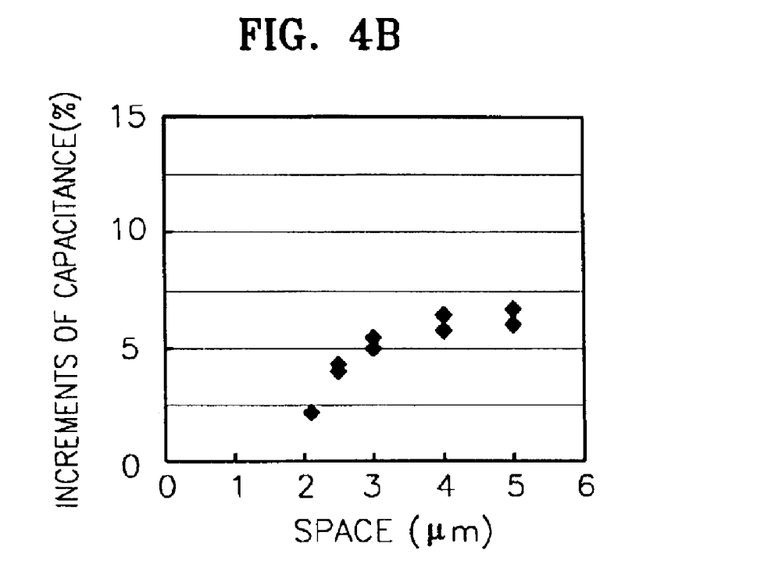
FIGS. 4B and 4C are graphical illustrations of the results of interconnection capacitance measured in consideration of dummy patterns in on-plane and off-plane modes using the structure primitives of FIG. 4A.
Figure 4C:
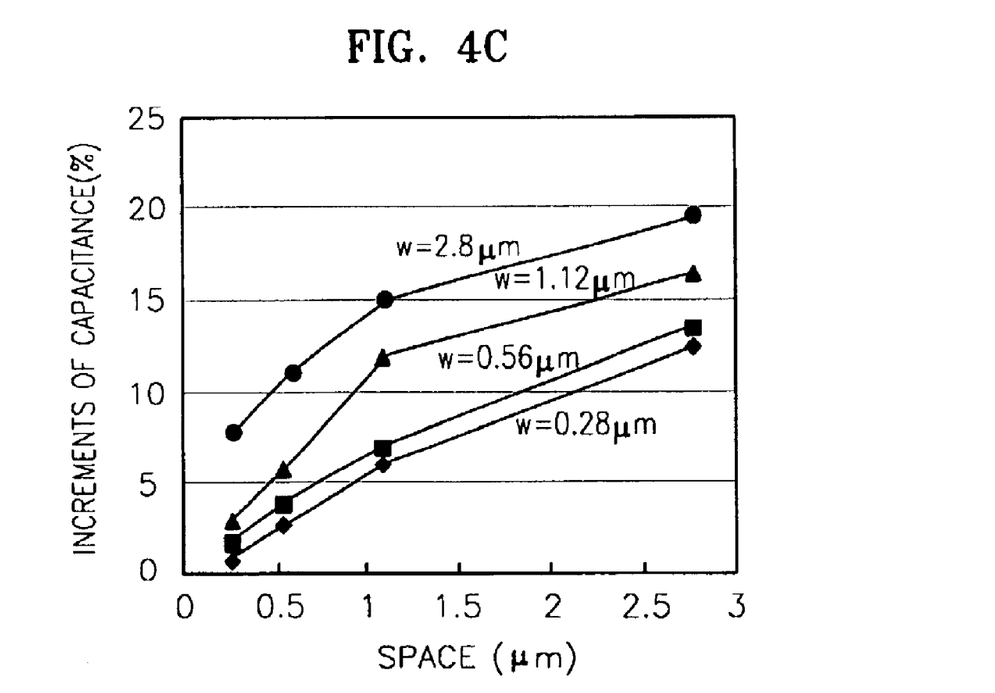

FIG. 4B is a graph showing the increments of interconnection capacitance in an on-plane dummy mode for the signal line M3 having a width of 0.28 μm. FIG. 4C is a graph showing the increments of interconnection capacitance in an off-plane dummy mode, where w represents the width of the signal lines. In FIGS. 4B and 4C, the X-axis represents the space between the signal lines. As seen in FIGS. 4B and 4C, the capacitance increased both in the on-plane and in the off-plane dummy modes. However, it is clear that the increments of capacitance are greater in the off-plane dummy mode than in the on-plane dummy mode.

In the actual design of a semiconductor integrated circuit, many signal lines are disposed and routed at minimum intervals. In such a situation, dummy patterns are not filled between the signal lines. Therefore, it is uncertain whether the entire interconnection capacitance and signal delays of the semiconductor integrated circuit will behave as shown as in FIGS. 4B and 4C.

Figure 5:
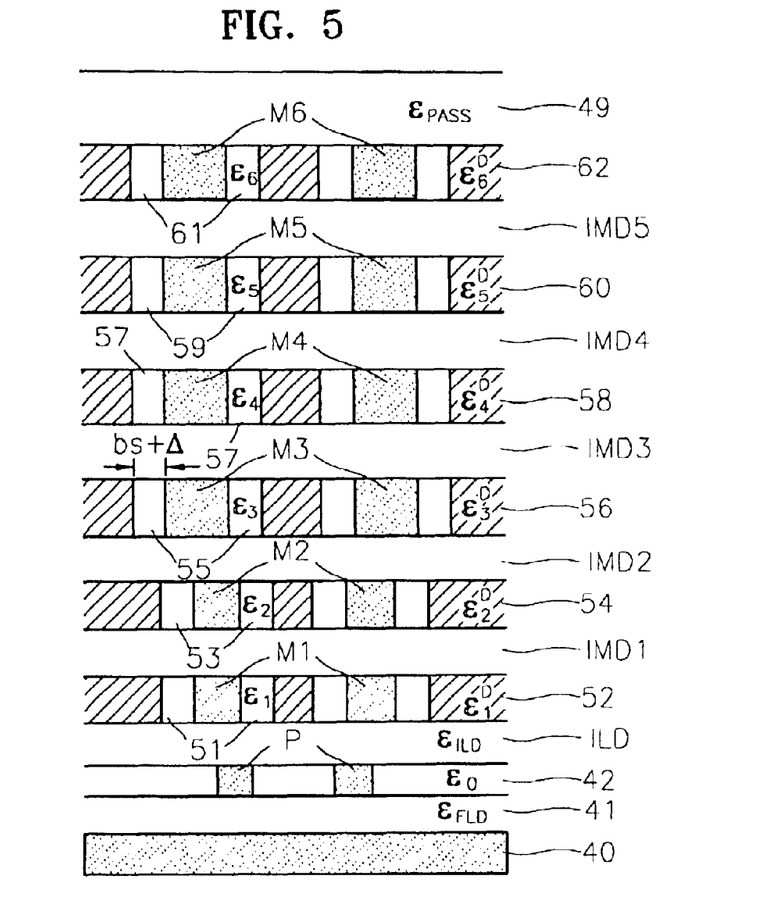
FIG. 5 is a cross-sectional view of interconnection structure primitives for generating input data of an RC extractor according to the present invention.

As a result, the interconnection structure shown in FIG. 4 has been modified into the interconnection structure illustrated in FIG. 5 to provide a new method of extracting capacitance which is applicable to interconnection routing where dummy patterns are not filled. In addition, the method permits the reproduction of capacitance with respect to the interconnection structure into which dummy patterns are inserted.

In at least one method of the present invention, a process of extracting capacitance is performed using only the primitives of the modified interconnection structure shown in FIG. 5, i.e., without having to generate a parasitic capacitance database in the consideration of dummy patterns. In particular, in the method of the prior art, a database file created in consideration of dummy patterns disposed between interconnection lines, i.e., signal lines, and a database created in consideration of the signal line data and the dummy patterns, as well as an input file generated from the vertical interconnection structure shown in FIG. 4 has to be input into an RC extractor or into a capacitance extracting program module. On the other hand, in a method according to the present invention, the extraction of the interconnection capacitance of the semiconductor integrated circuit is performed using only an input file generated from the primitives of the modified interconnection structure shown in FIG. 5. There is no need to consider a parasitic capacitance database file made with reference to dummy patterns as in the conventional methods.

In the primitives of the modified interconnection structure shown in FIG. 5, high-k dielectric layers 52, 54, 56, 58, 60, and 62 having high dielectric constants $\epsilon 1^D$, $\epsilon 2^D$, $\epsilon 3^D$, $\epsilon 4^D$, $\epsilon 5^D$, and $\epsilon 6^D$ are laid out in regions in which dummy patterns will be positioned during the manufacturing process. Low-k dielectric layers 51, 53, 55, 57, 59, and 61 having low dielectric constants $\epsilon 1$, $\epsilon 2$, $\epsilon 3$, $\epsilon 4$, $\epsilon 5$, and $\epsilon 6$ are conformally laid out between the high-k dielectric layers 52, 54, 56, 58, 60, and 62 and interconnection lines M1 through M6. Dielectric layers 51, 53, 55, 57, 59, and 61 fill the spaces between the interconnection lines M1 through M6 and are similar to buffer spacers designated by a dummy design rule. The width (bs+Δ) of the dielectric layers 51, 53, 55, 57, 59, and 61 and/or the width W and dielectric constants ($\epsilon i^D$, i=1, 2, 3, 4, 5, 6) of the high-k dielectric layers 52, 54, 56, 58, 60, and 62 are controlled to illustrate capacitance calculated in consideration of dummy patterns in either an on-plane mode or an off-plane mode.

Figure 6:
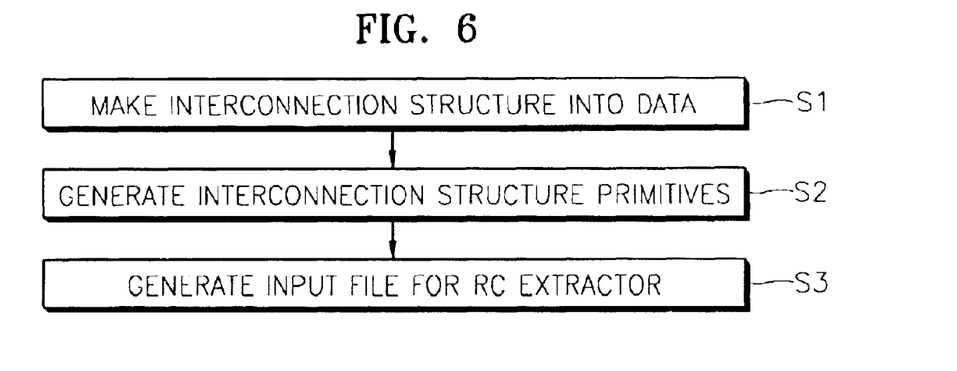
FIG. 6 is a flowchart of a process of generating an input file of an RC extractor according to the present invention.

Referring now to FIG. 6, a process of generating an input file of an RC extractor will be described. An input file program module converts the interconnection structure as shown in FIG. 3 into data through a predetermined program module (S1), taking into consideration routed interconnection lines and dummy patterns that will be filled between the interconnection lines in the manufacturing process. In the interconnection structure of FIG. 3, a plurality of dummy patterns are filled between the signal lines. These dummy patterns may be positioned in an on-plane mode or an off-plane mode with respect to the signal lines, i.e., interconnection lines. The interconnection structure data includes parameters related to the interconnection lines, e.g., the thickness and length of the interconnection lines and a preferable range of values of the distances between the interconnection lines. In addition, the interconnection structure data includes parameters related to the dummy patterns, such as a preferable range of values of the minimum distance between the dummy patterns and the interconnection lines (e.g., bs of FIG. 3).

Data for the interconnection structure primitives, which are made by changing portions of the dummy patterns into high-k dielectric materials (S2), is generated by the operation of a predetermined program module based on the interconnection structure data. The data for the interconnection primitives includes the dielectric constants and the width of high-k dielectric materials, the distance between the high-k dielectric materials and the interconnection lines (e.g., bs+Δ of FIG. 5), and the dielectric constants of the buffer dielectric layers for filling spaces between the high-k dielectric materials and the interconnection lines. The buffer dielectric layers are formed of insulating layers which are used to insulate the interconnection lines from each other. The width and dielectric constant of the high-k dielectric layers are determined so as to repeat a 3-dimensional simulation taken in consideration of the dummy patterns formed between the interconnection lines.

The result of the above is the generation of an input file for an RC extractor (S3). The input file for the RC extractor includes data on an interconnection structure in which insulating layers having low-k constants and high-k dielectric materials having high dielectric constants are filled between the interconnection lines, instead of dummy patterns made of insulating layers and metal. The RC extractor operates the input file and calculates interconnection capacitance values.

Figure 7A:
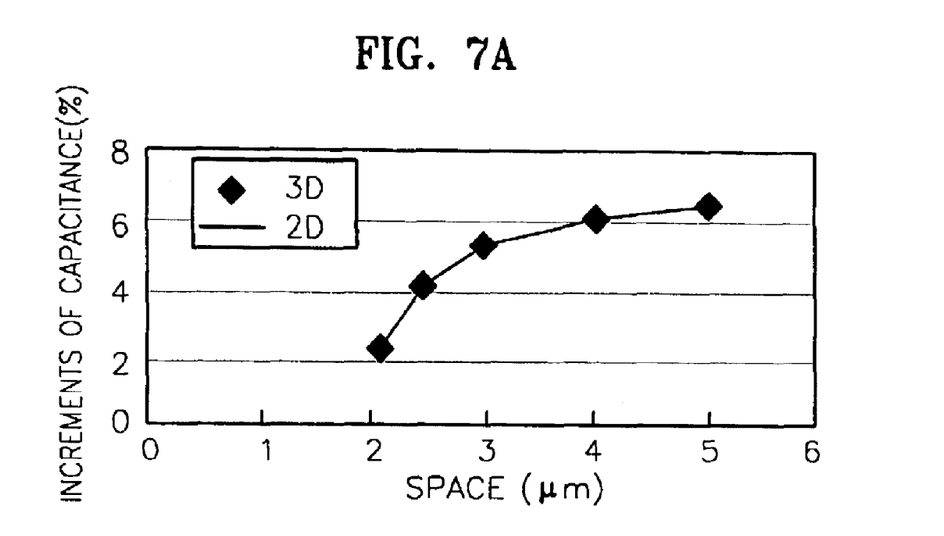
FIGS. 7A–7D are graphical illustrations depicting the adoption of input data based on the primitives of the interconnection structure to an RC extractor according to the present invention.
Figure 7B:
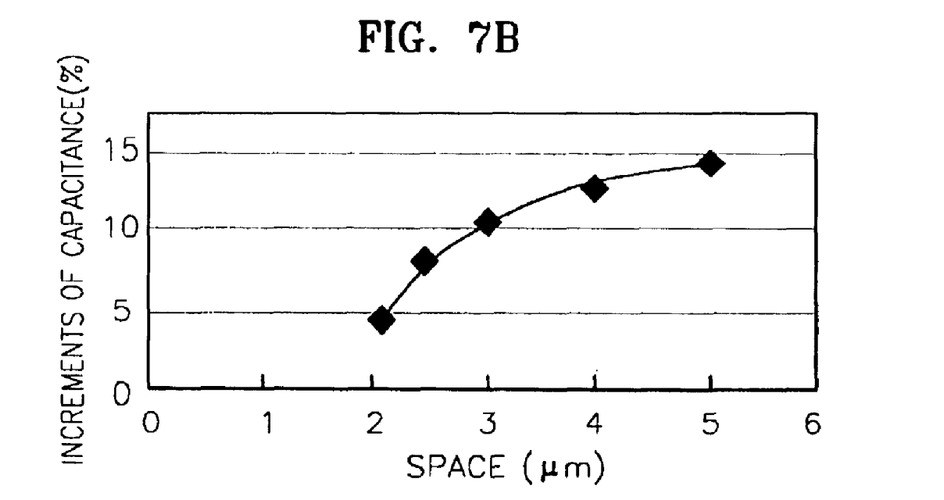
Figure 7C:
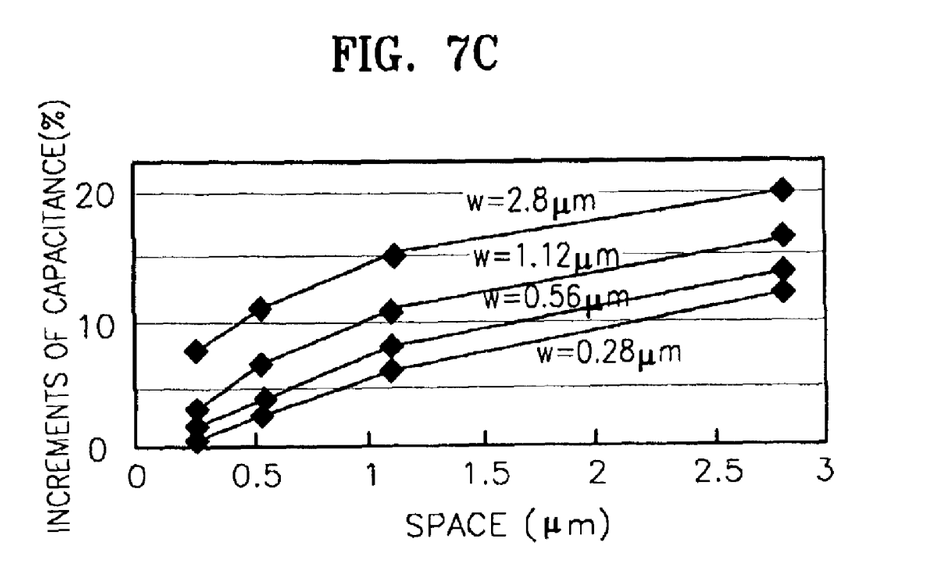
Figure 7D:
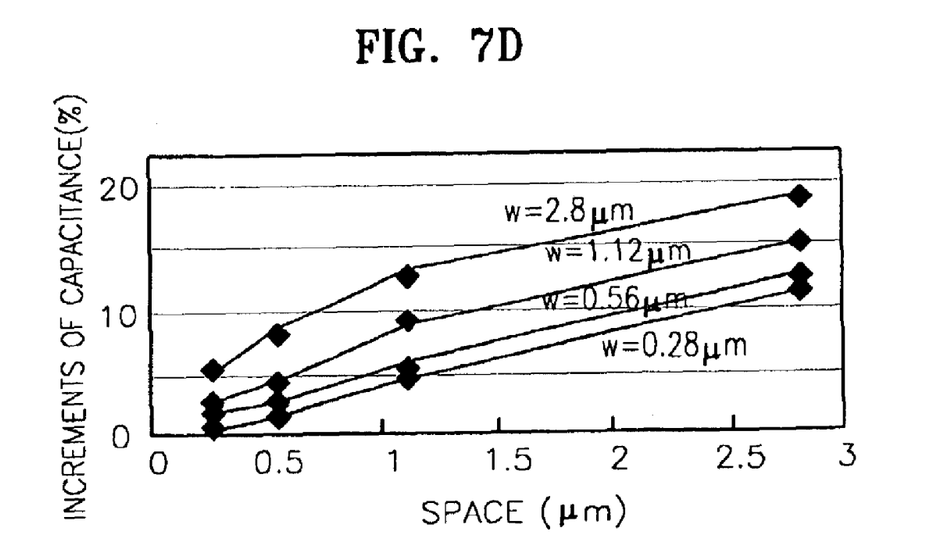

Referring now to FIGS. 7A–7D, it can be seen that the vertical axis represents increments of capacitance (%) in consideration of dummy patterns with respect to the capacitance of interconnection lines having no dummy patterns, and the horizontal axis represents the space between the signal lines. In particular, FIGS. 7A and 7B illustrate the capacitance of the signal lines M3 and M6 when dummy patterns are in an on-plane mode. FIGS. 7C and 7D illustrate the capacitance when the dummy patterns are in an off-plane mode. In FIG. 7D, w is the width of signal lines.

FIGS. 7A–7D illustrate the results of a 3-dimensional simulation, in which interconnection structure primitives were used and capacitance effects with respect to the dummy patterns of FIG. 4A were checked, are marked with the symbol ♦. The results of a 2-dimensional simulation of interconnection capacitance using the modified interconnection structure primitives of FIG. 5 are marked with a solid line. In FIG. 5, the width of the buffer insulating layers (bs) is 0.8 µm in each of the interconnection lines M1–M6. The dielectric constants of the high-k dielectric layers 52, 54, 56, 58, 60, and 62 are 28.0, 28.0, 28.5, 28.5, 28.5, and 30.5, respectively. It can be seen in FIGS. 7A–7D that the results of the 2-dimensional simulation of interconnection capacitance using the interconnection structure primitives of FIG. 5 are equal to the results of the 3-dimensional simulation using the interconnection structure primitives of FIG. 4A.

Figure 8A:
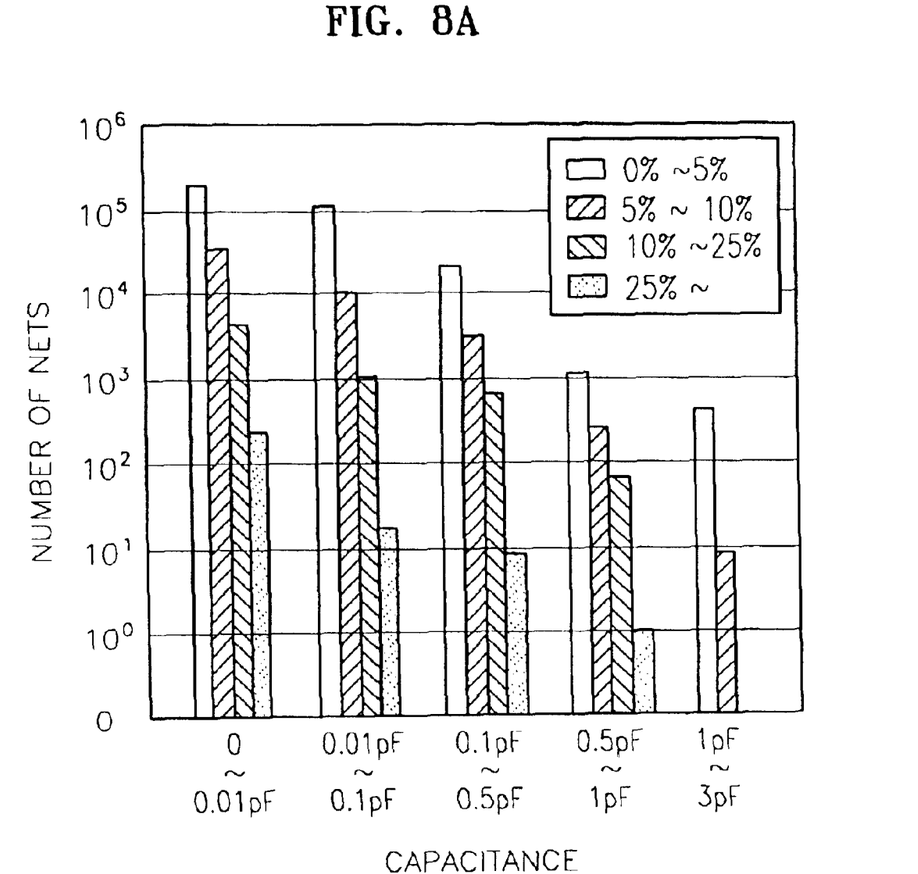
FIGS. 8A and 8B are graphical illustrations depicting the capacitance and signal delays of a semiconductor integrated circuit of 0.18 $\mu$m design rule according to the present invention.
Figure 8B:
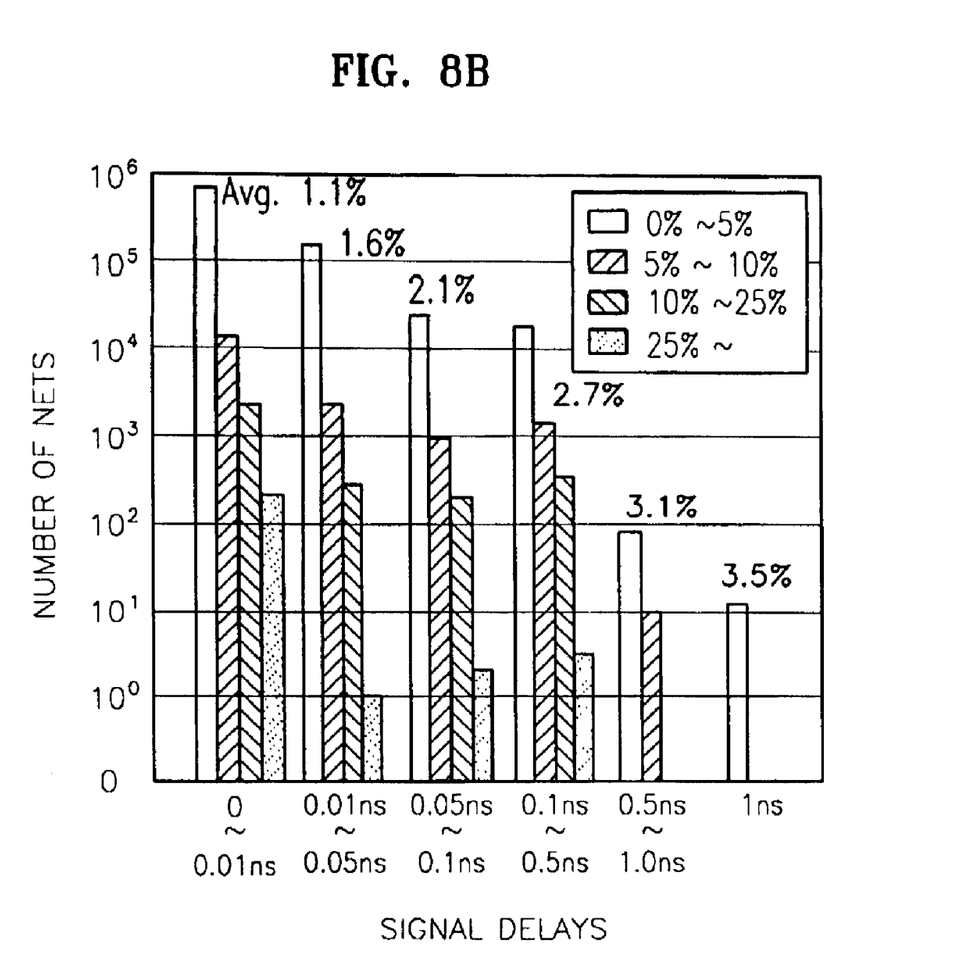

FIGS. 8A and 8B are graphical illustrations showing that global interconnection capacitance and signal delays are analyzed by the extraction method according to the present invention to a semiconductor integrated circuit having a design rule of 0.18 µm. The average increment of the interconnection capacitance is approximately 3–4%. This slight increment results because the distance between signal lines in a net is narrow and the routing density of interconnection lines is high. As a result, few dummy patterns are filled.

In such a situation, the increments of the interconnection capacitance represent differences between capacitances which are extracted without considering the dummy patterns using the interconnection structure primitives of FIG. 4A and capacitances which are extracted according to the present invention or the signal delays. On the other hand, if interconnection capacitances and/or signal delays are measured without considering the dummy patterns in a net in which a plurality of dummy patterns are filled, the measured values are different from interconnection capacitances and/or signal delays that are measured in consideration of the dummy patterns. This result can be ascertained by the considerable number of nets showing an increase of 25% in FIGS. 8A and 8B. Thus, it can be seen that a method of extracting the interconnection capacitances according to the present invention is performed in consideration of a dummy-filling effect.

As described above, a method of extracting capacitance according to the present invention does not require the consideration of dummy patterns through an RC extractor. Moreover, in the method of the present invention, the structure of an input file that is input to the RC extractor is changed. As a result, the method of extracting capacitance according to the present invention can easily be applied to various types of RC extractors. In addition, in the present invention, the structure in which the dummy patterns are changed into high-k dielectric materials is transformed into data. Thus, the time required for generating interconnection capacitance database due to the dummy patterns is not increased and the overall time required for extracting the interconnection capacitance is reduced.

Although the invention has been described with reference to preferable embodiments, it will be apparent to one of ordinary skill in the art that modifications of the described embodiments may be made without departing from the spirit and scope of the invention.

What is claimed is:

1. A method of extracting the interconnection capacitance of a semiconductor integrated circuit comprising the steps of:

converting an interconnection structure into first data, said interconnection structure having a plurality of signal lines and dummy conductive patterns disposed between the signal lines;

forming interconnection structure primitives by changing portions of said dummy patterns into high-k dielectric materials;

generating second data on said interconnection structure primitives based on said the first data; and extracting a capacitance of the interconnection structure by inputting the second data to RC extractor and operating the second data.

2. The method of claim 1, wherein said interconnection structure primitives include buffer dielectric layers formed along said signal lines between the high-k dielectric materials and the signal lines, said buffer dielectric layers having low dielectric constants.

3. The method of claim 2, wherein the second data includes dielectric constants and widths of the buffer dielectric layers.

4. The method of claim 2, wherein the buffer dielectric layers include insulating layers filled between said signals lines and the signal lines to insulate said signal lines in the interconnection structure primitives.

5. The method of claim 4, wherein the dielectric constants of the buffer dielectric layers are equal to the dielectric layers of the insulating layers.

6. The method of claim 1, wherein high-k materials form said high-k dielectric layers.

7. The method of claim 6, wherein the second data includes dielectric constants and widths of the high-k dielectric layers.

8. The method of claim 7, wherein the dielectric constants of the high-k dielectric layers are determined using results of a 3-dimensional simulation of an interconnection structure performed in consideration of dummy patterns.

9. The method of claim 1, wherein the dummy patterns and the signal lines are positioned in an on-plane mode in the interconnection structure.

10. The method of claim 1, wherein the dummy patterns and the signal lines are positioned in an off-plane mode in the interconnection structure.

11. A recording medium for recording a method of extracting the interconnection capacitance of a semiconductor integrated circuit comprising:

a first program module for converting an interconnection structure into first data, said interconnection structure having a plurality of signal lines and dummy conductive patterns disposed between the signal lines;

a second program module for generating second data on interconnection structure primitives formed by changing portions of said dummy conductive patterns into high-k dielectric materials; and a third program module for extracting capacitance of said interconnection structure by inputting the second data to an RC extractor and operating the second data.

12. The recording medium of claim 11, wherein said high-k materials for high-k dielectric layers.

13. The recording medium of claim 12, wherein the second data includes dielectric constants and widths of the high-k dielectric layers.

14. The recording medium of claim 13, wherein dielectric constants of the high-k dielectric layers are determined using results of a 3-dimensional simulation of an interconnection structure which are performed in consideration of the dummy patterns.

15. The recording medium of claim 11, wherein said interconnection structure primitives include buffer dielectric layers formed along said signal lines between said high-k dielectric materials and said signals lines.

16. The recording medium of claim 15, wherein second the data includes dielectric constants and widths of buffer dielectric layers.

17. The recording medium of claim 11, wherein the dummy patterns and the signal lines are positioned in an on-plane mode in the interconnection structure.

18. The recording medium of claim 11, wherein the dummy patterns and the signal lines are positioned in an off-plane mode in the interconnection structure.

* * * * *